(12) United States Patent
Selvin et al.

(10) Patent No.: US 6,614,118 B1
(45) Date of Patent: Sep. 2, 2003

(54) STRUCTURES TO MECHANICALLY STABILIZE ISOLATED TOP-LEVEL METAL LINES

(75) Inventors: Eric Selvin, San Jose, CA (US); Krishna Seshan, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/464,058

(22) Filed: Dec. 15, 1999

(51) Int. Cl.[7] .............................................. H01L 23/48
(52) U.S. Cl. ........................ 257/758; 257/324; 257/358; 257/774
(58) Field of Search ................................ 257/758, 324, 257/385, 211, 503, 774, 458; 438/98, 453, 523, 533, 622, 625

(56) References Cited

U.S. PATENT DOCUMENTS

| | | | |
|---|---|---|---|
| 4,841,354 A | * 6/1989 | Inaba | 357/71 |
| 5,475,255 A | * 12/1995 | Joardar et al. | 257/547 |
| 6,078,068 A | * 6/2000 | Tamura | 257/203 |
| 6,137,155 A | * 10/2000 | Seshan et al. | 257/640 |

* cited by examiner

Primary Examiner—Olik Chaudhuri
Assistant Examiner—Nathan W. Ha
(74) Attorney, Agent, or Firm—Blakely, Sokoloff, Taylor & Zafman LLP

(57) ABSTRACT

The invention provides in one embodiment thereof an integrated circuit. The integrated circuit includes a first interconnection metallization layer formed upon a substrate. The integrated circuit further includes a second interconnection metallization layer formed upon the first interconnection metallization layer. The second interconnection metallization layer has formed therein at least one signal line coupled to the first interconnection metallization layer. The second interconnection metallization layer has formed therein at least one protective structure that surrounds the signal line.

6 Claims, 4 Drawing Sheets

STRUCTURES TO MECHANICALLY STABILIZE ISOLATED TOP-LEVEL METAL LINES

BACKGROUND OF THE INVENTION (1) Field of the Invention

The invention relates to semiconductor devices and circuit fabrication. More specifically, the invention relates to integrated circuits that include structures to protect the integrated circuits against various types of damages.

(2) Background of the Invention

Often semiconductor dies are subjected to mechanical agents (forces) that are likely to damage the dies. Some of these forces are surface forces that may arise, for example, when semiconductor dies are packaged. Moreover, packages, which are not completely rigid, transmit some of the external forces to the die. These forces cause delamination of various structures located at the top of the dies such as soft and hard passivation layers as well as top layer metal lines. Delamination allows moisture and other impurities to penetrate the semiconductor die.

FIG. 1 illustrates a top view of die 100. Die 100 includes die active area 102. Near edges 106 of die active area 102 are small isolated metal interconnect lines (interconnection metallization) 104 formed in the top metal layer also known as the terminal metal layer. The metal interconnect lines typically route signals on die 100. One current integrated circuit chip technology utilizes up to five layers of interconnect, referenced by M1, M2, M3, M4, and M5. In such a scheme, the terminal metal layer is M5. Lines 104 are portions of signal lines that are routed in lower layers of metal (not shown) found beneath terminal metal layer M5. Lines 104 have been shown to fail mechanically when the dies are packaged or when the packaged dies are subjected to temperature cycling during reliability testing. It is desired to protect the above-mentioned lines against the agents that damage these lines.

SUMMARY OF THE INVENTION

The invention provides in one embodiment thereof an integrated circuit. The integrated circuit includes a first interconnection metallization layer formed upon a substrate. The integrated circuit further includes a second interconnection metallization layer formed upon the first interconnection metallization layer. The second interconnection metallization layer has formed therein at least one signal line coupled to the first interconnection metallization layer. The second interconnection metallization layer has formed therein at least one protective structure that surrounds the at least one signal line.

BRIEF DESCRIPTION OF THE DRAWINGS

The features, aspects, and advantages of the invention will become more fully apparent from the following Detailed Description, appended claims, and accompanying drawings in which:

DETAILED DESCRIPTION OF THE INVENTION

In the following description, numerous specific details are set forth to provide a thorough understanding of the invention. However, one having ordinary skill in the art should recognize that the invention may be practiced without these specific details. In some instances, well-known circuits, structures, and techniques have not been shown in detail to avoid obscuring the invention.

The invention provides in one embodiment thereof an integrated circuit. The integrated circuit includes a substrate and a first interconnection metallization or metal layer formed upon the substrate. The integrated circuit further includes a second interconnection metallization or metal layer formed upon the first metal layer. The second metal layer has formed therein at least one signal line coupled to the first metal layer. The second metal layer has formed therein at least one protective structure that surrounds the at least one signal line.

Figure 1:
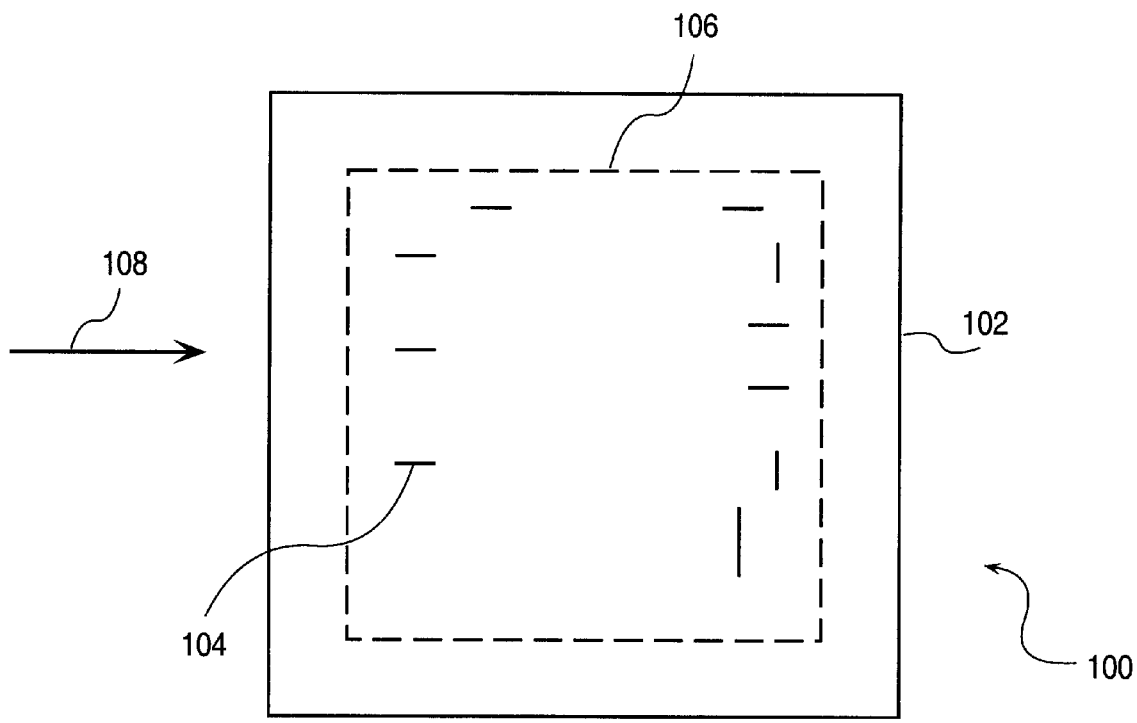
FIG. 1 illustrates a top view of a typical prior art die.
Figure 2:
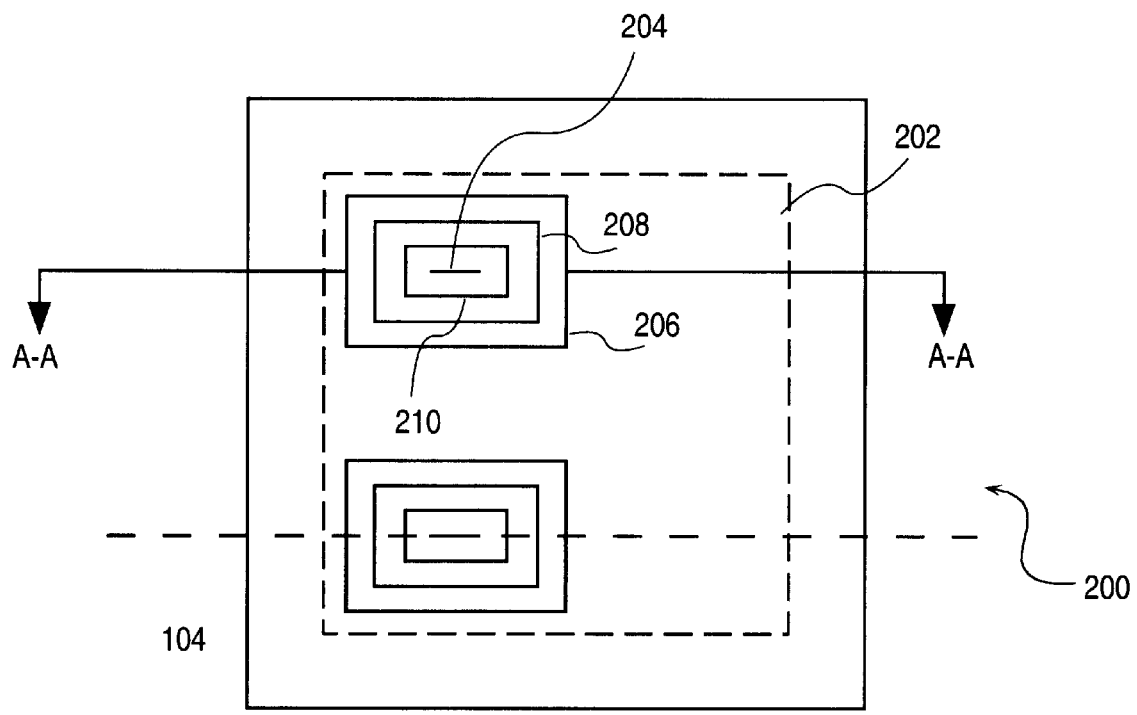
FIG. 2 illustrates a die with protective structures according to one embodiment of the invention.

FIG. 2 is a top view of die 200 of an integrated circuit (e.g., chip or die) that has a terminal interconnection metallization or metal layer (e.g., M5 layer) in which are formed protective structures 206, 208, and 210. The protective structures surround isolated signal line 204 formed out of the terminal metallization or metal layer and absorb the forces exerted at the surface of the die. A suitable material for the terminal interconnection metallization or metal layer is a metal material of, for example, elemental metal or a metal alloy. Aluminum and copper and their alloys are examples of suitable terminal metal. In one embodiment, protective structures 206, 208 and 210 surround signal line 204, with signal line 208 surrounding signal line 210 and signal line 206 surrounding signal line 208 as shown in FIG. 2.

In one embodiment structures 206, 208, and 210 are continuous structures (closed loops) that surround at 360 degrees signal line 204 to protect signal line 204 from forces that may be exerted from various directions. In FIG. 2, the structures are rectangular in form. In one embodiment, each structure 206, 208, and 210 has a width on the order of 2–15 microns with the space between (i.e., separating) structures 206, 208, and 210 approximately 2 microns according to a current design rule. The similar design rule example dictates a spacing between signal line 204 and structure 210 of approximately 2 microns. Structures 206, 208, and 210 are formed, in one embodiment, in the terminal metallization layer through patterning techniques commensurate with patterning the terminal metallization layer (e.g., M5). Thus, in one typical technique, a blanket metallization of a metal material is introduced over the substrate and patterned by, for example, etching through a mask to define structures 206, 208, and 210 and signal line 204.

The multiplicity of structures 206, 208, and 210 serve, in one aspect, the objective that if the outer structure, say structure 206, breaks, there are other remaining structures 208 and 210 in place capable of protecting signal lines 204 by absorbing the forces exerted on the integrated circuit (e.g., chip or die). In one embodiment structures 206, 208, and 210 may be coupled to the lower supply rail (ground). In another embodiment, structures 206, 208, and 210 are coupled together to the higher supply rail ($V_{cc}$). Coupling the structures to $V_{cc}$ or ground serves to reduce stray charges that may build up on structures 206, 208, and 210 thereby minimizing the capacitive impact that may be introduced by structures 206, 208 and 210.

Figure 3:
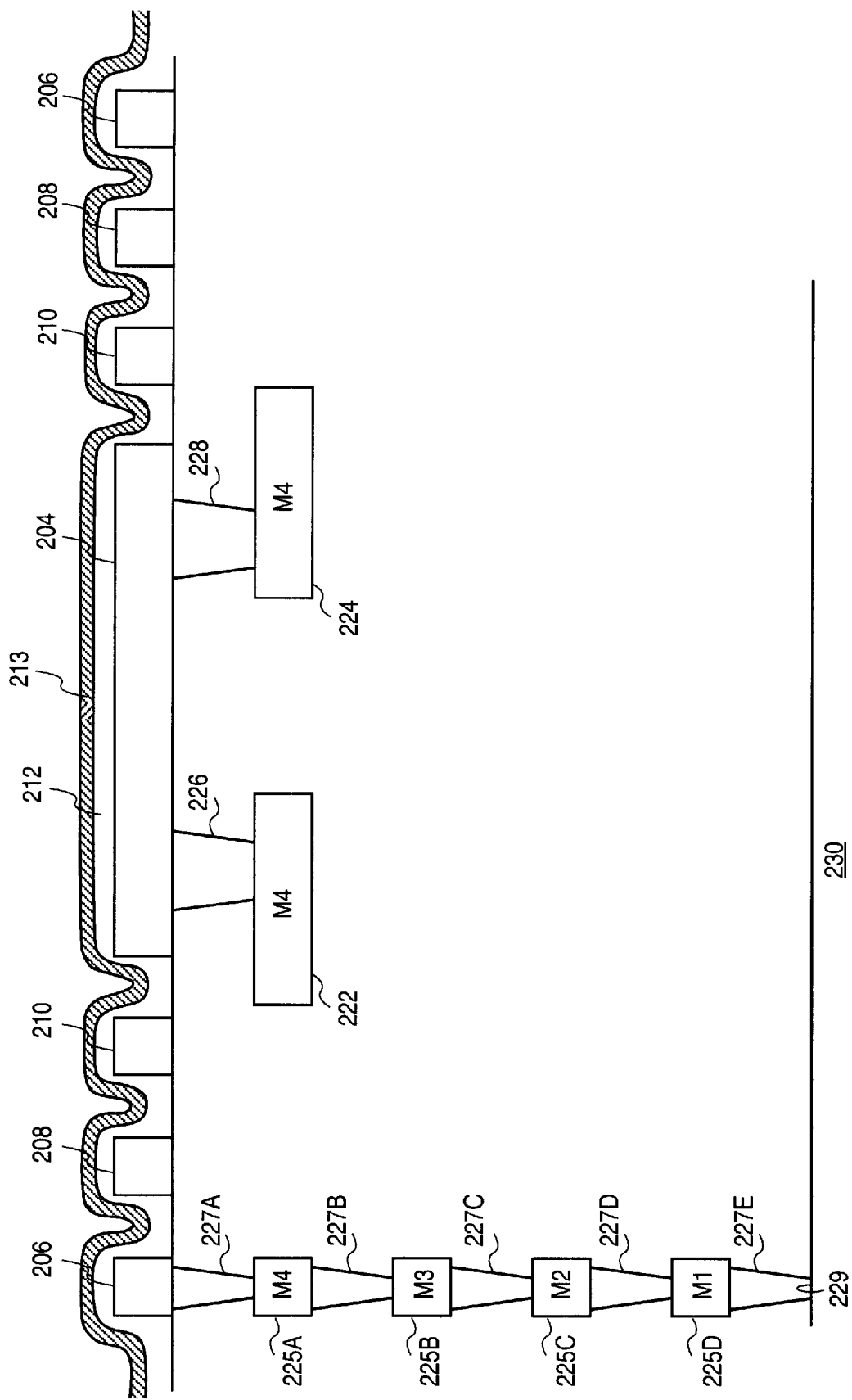
FIG. 3 illustrates a cross sectional view through the die illustrated in FIG. 2.

FIG. 3 illustrates a cross sectional view taken through line A—A of FIG. 2. In this illustration, the terminal interconnection metallization or metal line (e.g., metal layer M5) includes signal line 204 surrounded by protective structures 206, 208, and 210. Below signal line 204 there are two interconnection metallization or metal four (M4) structures 222 and 224 coupled to isolated line 204 by way of vias or contact plugs 226 and 228, respectively, such as, for example, titanium and/or titanium-tungsten vias or contact plugs.

FIG. 3 also shows contact structure 206 coupled by way of vias or contact plugs and landing pads to substrate 230, such as a silicon substrate. Landing pads 225A, 225B, 225C, and 225D are patterned in their respective metallization layers M4, M3, M2, and M1 to provide conductive coupling points for vias or contact plugs 227A, 227B, 227C, and 227D. Contact plug 227E couples structure 206 to contact point 229 of substrate 230 that may be coupled, for example, to the lower or higher supply rail. Similar configurations can be implemented for contact structures 208 and 210 either isolated individually or sharing landing pads and the contact print with structure 206. It is to be appreciated that the landing pads and vias or contact plugs are generally surrounded by dielectric material.

As noted above, the terminal interconnection metallization and metal structures (signal line 204 and structures 206, 208, and 210) are formed by standard processes including patterning the metal structures, etching the metal, etc. A passivation layer including hard passivation layer 212 of, for example, silicon nitride, and soft passivation layer 213 of, for example, a polyimide is introduced conformally over the terminal metal structures.

In the above embodiment, essentially sacrificial structures were illustrated surrounding a terminal signal line. It is to be appreciated that such structures can have a variety of configurations and may vary in number depending on design. The structures are incorporated into a terminal metallization layer, in one measure, to protect the terminal signal line(s). The actual/degree of protection and thus incorporation and design of such structures will be dictated, in large part, on design rules including available area and cost.

Figure 4:
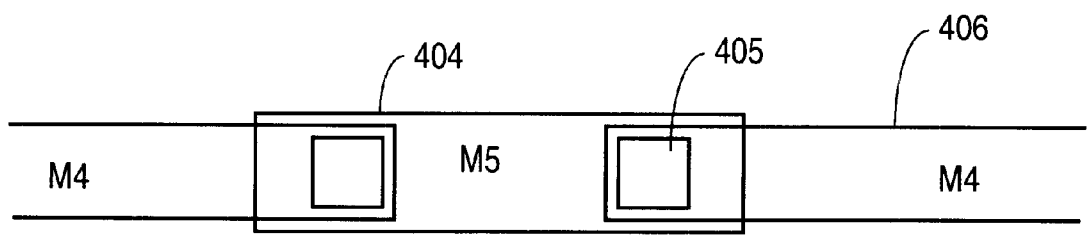
FIG. 4 illustrates another embodiment of the invention where the top metal layer lines are wider than underlying metal lines.

FIG. 4 illustrates another embodiment of the invention where terminal interconnection metallization signal line 404 is protected against damaging agents by making it wider. The larger width of these lines generally enhances the stability of these lines. In one aspect, interconnection metallization signal line 404 in the terminal metallization layer (e.g., M5) is much wider than a corresponding width of interconnection metallization signal lines formed in inferior layers (e.g., M4, M3, etc.). In the example shown in FIG. 4, signal line 404 is wide enough to completely cover vias or contact plugs 405. Using a current design rule where the thickness of a typical interconnection metallization or metal signal line (e.g., M4, M3, etc.) is approximately 2 microns, signal line 404 may have, in one embodiment, a width of approximately 2.5 microns. The additional width provides additional volume and surface area of the terminal metal signal line provides improved strength and durability thus improving its resistance to damage by external forces.

In the previous detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restriction sense.

What is claimed is:

1. An integrated circuit comprising:

a first interconnection metallization layer formed upon a substrate; and a second interconnection metallization layer formed upon the first interconnection metallization layer, the second interconnection metallization layer having formed therein at least one signal line coupled to the first interconnection metallization layer;

wherein the second interconnection metallization layer has formed therein a plurality of protective structures (PSi) for i=. . . N, a first protective structure PS1 surrounding the at least one signal line, each protective structure PSi surrounding a previous protective structure PSi-1.

2. The integrated circuit of claim 1, wherein one of the at least one protective structure is coupled to a low rail supply voltage.

3. The integrated circuit of claim 1, wherein one of the at least one protective structure is coupled to a high rail supply voltage.

4. The integrated circuit of claim 1, wherein the at least one protective structure has a continuous loop shape that encloses the signal line.

5. The integrated circuit of claim 1, wherein the at least one protective structure is spaced from the signal line at approximately 2 microns.

6. The integrated circuit of claim 1, wherein the first interconnection metallization layer has a first volume and the second interconnection metallization layer has a second volume greater than the first volume.

* * * * *